United States Patent [19]

Hofgräff

[11] Patent Number: 5,149,995

[45] Date of Patent: Sep. 22, 1992

[54] ELECTRICAL CIRCUIT FOR THE SWITCH-OFF RELIEF OF A CONTROLLABLE SEMICONDUCTOR SWITCH

[75] Inventor: Hans G. Hofgräff, Hopzkirchen, Fed. Rep. of Germany

[73] Assignee: Transtechnik GmbH, Fed. Rep. of Germany

[21] Appl. No.: 585,313

[22] Filed: Sep. 19, 1990

[30] Foreign Application Priority Data

Sep. 22, 1989 [DE] Fed. Rep. of Germany ....... 3931729

[51] Int. Cl.⁵ ............................................. H03K 17/72
[52] U.S. Cl. .................... 307/633; 307/246; 363/123
[58] Field of Search .............. 307/633, 638, 639, 246; 363/27, 54, 57, 128, 135, 123

[56] References Cited

FOREIGN PATENT DOCUMENTS

| 3609886 | 10/1986 | Fed. Rep. of Germany . |
| 0618432 | 12/1981 | Japan ..................................... 307/633 |
| 0101426 | 6/1982 | Japan ..................................... 307/633 |
| 0113769 | 6/1984 | Japan ..................................... 307/633 |
| 0090027 | 4/1987 | Japan ..................................... 307/633 |

OTHER PUBLICATIONS

German publication, "DEZ Elekrische Energie-Technik," No. 1, pp. 36-38, 41 (1985).

*Primary Examiner*—John Zazworsky
*Attorney, Agent, or Firm*—Marshall, O'Toole, Gerstein, Murray & Bicknell

[57] ABSTRACT

A circuit providing switch-off relief of controllable semiconductor switches, such as a gate turn-off thyristor. A series connected storage capacitor and diode are placed in parallel across the thyristor. A controllable discharge switch is driven by a control circuit so as to close a discharge current circuit connecting the storage capacitor to the primary winding of a transformer. The discharge switch is responsive to the voltage polarity across the diode to enable a current to flow through the primary winding for discharging the storage capacitor and for interrupting the current flow through the primary winding for discharging the energy stored in the transformer through a secondary winding.

4 Claims, 1 Drawing Sheet

ELECTRICAL CIRCUIT FOR THE SWITCH-OFF RELIEF OF A CONTROLLABLE SEMICONDUCTOR SWITCH

The invention relates to an electrical circuit for the switch-off relief of a controllable semiconductor, in particular a disconnectable thyristor or gate turn-off switch (GTO).

It is known that controllable semiconductors, in particular gate turn-off switches or GTOs, require switch-off relief when inductively loaded to limit the voltage-rise rate during switch-off. At high switch frequencies, developing energy can no longer be discharged in a simple manner and active switch-off relief networks have to be provided. As far as direct-current controllers or regulators are concerned, the feedback of energy, stored in a capacitor, to the load or the mains supply is beneficial.

An electrical circuit of the earlier mentioned type is known from "DEZ Elektrische Energie-Technik", 1985, No. 1, pages 36–38 and 41. In this known circuit, a storage capacitor is connected, via a diode and a further disconnectable thyristor, to the primary winding of a transformer, which is itself connected on its secondary side via a bridge-rectifier circuit to a current consumer, i.e. an operating-voltage source (direct-voltage intermediate circuit). An inductance is provided in one of the bridge arms of the rectifier. Furthermore, a free-running diode is provided, connecting the series arrangement of the primary winding and a second GTO. In addition, the second GTO is connected synchronous with the first GTO. The switch-off is effected when the storage capacitor is discharged. When the second GTO is fully loaded, a discharge current passes through the primary winding of the transformer so that a corresponding secondary current in its secondary winding passes through the bridge rectifier. As soon as the second GTO is switched off, the energy, which has been stored due to the inductance of the primary winding of the transformer, discharges through the free-running diode. On the secondary side of the transformer, a current then passes through the other bridge arm of the rectifier.

In this arrangement, it is considered disadvantageous that a control circuit, which is not described in detail in the specification but known to be elaborate, is required for the second GTO. This second GTO must have the same cut-off voltage as the first GTO. Furthermore, the options available for the feedback of the energy stored in the capacitor are limited.

From DE 36 09 886 A1 is known a damping circuit for a GTO thyristor with auxiliary damping circuits arranged along a main damping circuit between the anode and the cathode of the GTO. They are controlled relative to the current flowing through the GTO. Here again, the construction is relatively complicated.

It is an object of the present invention to provide an improved electric circuit of the earlier type mentioned so that, with a simplified construction, an improved energy-feedback is made possible.

According to the present invention there is provided an electrical circuit for the switch-off relief of a controllable semiconductor switch such as a gate turn-off switch thyristor comprising a storage capacitor arranged in parallel to the switch; a first diode in series with the capacitor and in parallel with the switch; a discharge switch; a control circuit for the discharge switch; a transformer with a primary winding and a secondary winding, the primary winding being in series with the discharge switch which can thereby close a discharge-current circuit connecting the capacitor to the primary winding so that the energy stored in the capacitor can be tapped at the secondary winding of the transformer; and wherein the improvement comprises arranging the control circuit to be connected to the input side of the first diode so that the discharge switch operates depending upon the polarity of the voltage across the first diode.

Thus the object of the invention resides in the fact that the automatic switch-off of the discharge switch by the discharged capacitor and the automatic switch-on of the discharge switch during switch-on of the controllable semiconductor switch takes place by driving the discharge switch in accordance with the polarity of the voltage at the first diode. As long as the controllable semiconductor switch is open, only a substantially negligible residual voltage is present at the first diode. As soon as the controllable semiconductor switch switches through, the full voltage of the storage capacitor lies across the first diode. When this capacitor has been discharged and the current flow is maintained due to the inductance of the primary winding of the transformer, the polarity of the voltage at the diode is reversed thereby opening the discharge switch.

The transformer at its secondary winding is preferably switched as a blocking converter so that when the discharge switch is closed energy stored in the capacitor is stored in the primary winding of the transformer and released on the secondary side on opening of the discharge switch. This is possible by way of a one-way rectifier arrangement. The inductance of the primary winding, the capacity of the capacitor, and the minimum switch-on time of the controllable semiconductor switch are co-ordinated in such a way that safe discharge of the capacitor can take place during the (minimum) switch-on period of the controllable semiconductor switch. The discharge switch is preferable a MOSFET.

The invention will now be described by way of example with reference to the accompanying drawing, in which.

Figure 1:
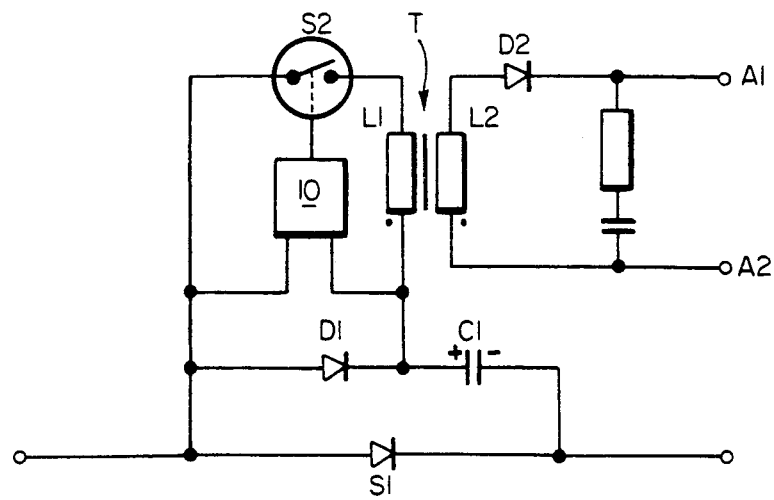
FIG. 1 is a circuit diagram of one embodiment of the invention.

In FIG. 1 is shown a controllable semiconductor switch S1, arranged to be a gate turn-off switch or GTO—as is shown by way of the circuit symbol. In parallel with the GTO is a series arrangement, comprising a first diode D1 and a storage capacitor C1. The cathode of the first diode D1 is connected to one terminal of a primary winding L1 of a transformer T, the other terminal of which is connected, via a discharge switch S2, to the anode of the diode D1. Said discharge switch S2 is opened and closed by means of a control circuit 10, which is connected with its control inputs parallel to the first diode D1, so that it is responsive to the voltage polarity on the first diode D1.

The transformer T is connected with one terminal of its secondary winding L2 to the anode of the secondary diode D2, the cathode of which is connected to an output terminal A1. The other terminal of the secondary winding L2 is connected to another output terminal A2. Between output terminal A1 and A2 is a series arrangement of a capacitor and a resistor.

The control circuit 10 is arranged so that switch S2 is closed when the first diode D1 is biased in the reverse or blocking direction and switch S2 is open when, due to respective forward bias conditions, a current begins to pass through the diode D1.

Furthermore, the windings of the transformer T are arranged as shown in FIG. 1, so that on the secondary side a current passes into a load, connected to output terminals A1, A2, by way of discharge of the stored energy, if the primary-sided current circuit is interrupted by the opening of switch S2. Thus the transformer T acts as blocking converter in which a current is enabled to flow in the secondary winding when a flow of current through the primary winding is interrupted.

The arrangement functions in such a manner that, with GTO S1 switched off, capacitor C1 is charged via the diode D1 with the polarity shown in FIG. 1, under a defined voltage rise. If GTO S1 is now switched on, then the anode of diode D1 is connected via GTO S1 to the negative potential terminal of the capacitor C1. Thus a voltage, which is reverse biasing diode D1 in the blocking direction, is present at the input terminals of the control circuit 10. Thereupon the circuit 10 acts to close the discharge switch S2 so that the capacitor C1 is discharged via the primary winding L1 of the transformer T, the switch S2 and the GTO S1. Owing to the diode D2, no current can flow in the secondary circuit of the transformer T. Hence, the primary winding L1 of transformer T acts as a choke with a defined inductance.

When the capacitor C1 is discharged so that its voltage has dropped to virtually zero, then due to the inductance of the transformer T the current continues to flow via the diode D1 and the primary winding L1 so that there is now a voltage in the opposite direction on diode D1. This voltage, which is probed by the control circuit 10, causes the switch S2 to be opened. The energy stored in transformer T can now initiate a current flow in the forward direction of the diode D2 in the secondary circuit of the transformer T so that energy transferred from the capacitor C1 into the transformer T can be released to the load, which is connected to the terminals A1, A2.

The load connected to the output terminals A1, A2, can be a primary network, since the transformer T is connected as a blocking converter.

A preferred practical embodiment of the invention will now be described in more detail with reference to FIG. 2.

As the diagram shows, the gate turn-off switch S1 is bridged, as in the previously described embodiment, by the series arrangement of a diode D1 and a discharge capacitor C1. The anode of the diode D1 is thus connected to the anode of the GTO S1.

The cathode of the diode D1 is connected to one terminal of a primary winding L1 of a transformer T, the other terminal of which is connected to the anode of a diode D3. The cathode of the diode D3 is connected to the drain connection of an N-channel Enhancement MOSFET T1. The source connection of MOSFET T1 is connected to the anode of the diode D1.

To protect the MOSFET T1, its drain-source-path is bridged by means of an RC series arrangement. Furthermore, the series arrangement, consisting of the MOSFET T1 and the diode D3 at the input side, is bridged by a varistor in a known manner.

The gate connection of the MOSFET T1 is connected to the cathode of a diode D4, the anode of which is connected, via a resistor R1, to the cathode of diode D1. At the connection point between the diode D4 and the resistor R1 lies the cathode of a Zener diode Z1, the anode of which is connected to the anode of diode D1. Furthermore, a pnp transistor T2 is connected with its base also connected at said connection point. The collector of the transistor T2 is connected, via a resistor R2, to the anode of the diode D1. The emitter of the transistor T2 is connected to the gate of MOSFET T1. In addition, the gate of the MOSFET T1 is connected via a resistor R3 to the anode of the diode D1.

In this embodiment of the invention, the control circuit 10 as shown in FIG. 1 as a block is thus composed of the components R1 to R3, Z1, D4 and T2. The operation of the circuit arrangement corresponds exactly with that previously described with reference to FIG. 1, as will be clear to the man skilled in the art. A substantial advantage of this arrangement, relative to the state of the art, is that no potential-free, elaborate drive arrangement for the discharge switch is required.

Figure 2:
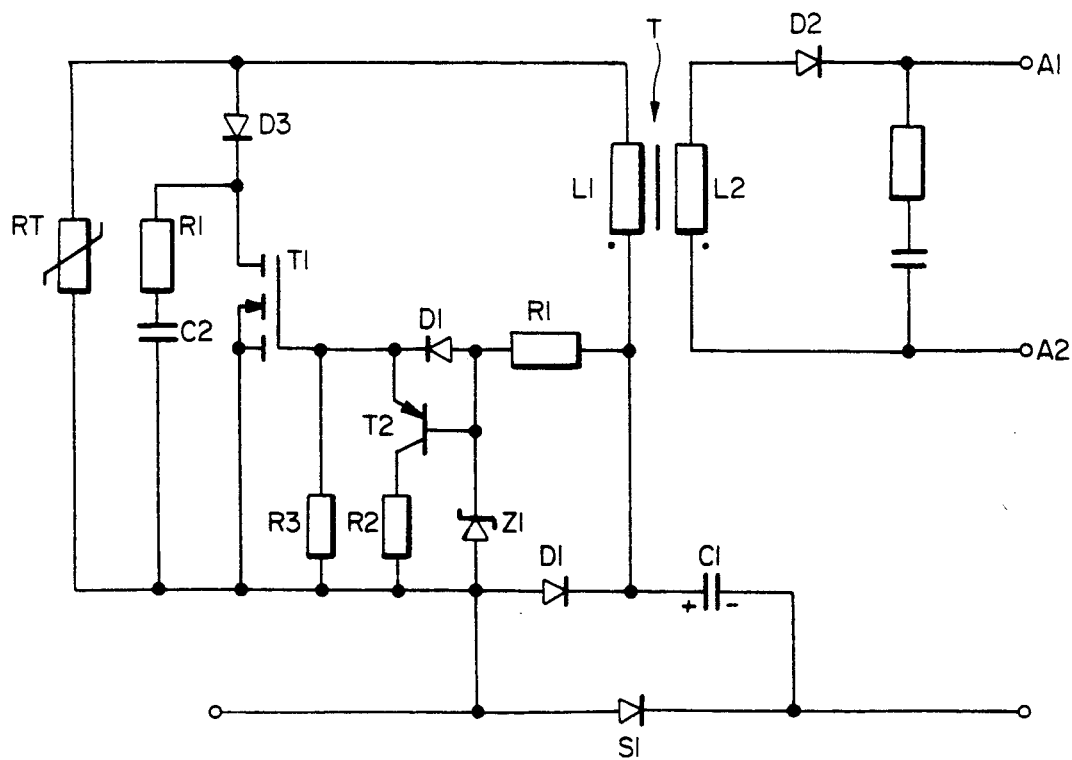
FIG. 2 is a circuit diagram of a preferred embodiment of the invention.

In FIG. 2, with GTO S1 switched off, capacitor C1 is charged via the diode D1. If GTO S1 is now switched on, the anode of diode D1 is connected to the negative potential terminal of capacitor C1 to reverse bias D1, thereby connecting the positive potential terminal of C1 to the anode of diode D4 through resistor R1. Since the cathode of D4 is connected through resistor R3 and GTO S1 to the negative potential terminal of C1, diode D4 is forward biased. With the gate of MOSFET T1 at a more positive potential than the source element, MOSFET T1 turns on to allow C1 to discharge via the primary winding L1, diode D3 and MOSFET T1.

What is claimed is:

1. An energy feedback thyristor circuit comprising:
   a gate turn-off thyristor switchable between on and off states;
   a first diode connected in series combination with a storage capacitor and said series combination connected in parallel with said gate turn-off thyristor, wherein a free diode end is connected to one end of said gate turn-off thyristor and a free storage capacitor end is connected to the other end of said gate turn-off thyristor;
   a transformer having a primary winding and a secondary winding;
   a controllable discharge switch;
   one end of said primary winding connected intermediate said first diode and storage capacitor in said series combination and the other end of said primary winding connected to one end of said controllable discharge switch;
   the other end of said controllable discharge switch connected to said free diode end; and
   a control circuit having an output operatively coupled to said controllable discharge switch, and having an input coupled to said first diode for responding to the voltage polarity across said first diode;
   said control circuit closing said controllable discharge switch when a voltage polarity in reverse bias direction is applied to said first diode during switching on of said gate turn-off thyristor, and opening said controllable discharge switch when a voltage polarity forward bias direction is applied to said first diode during switching off of said gate turn-off thyristor for storing an inductive energy within said transformer during said switching on of said gate turn-off thyristor by enabling a current to flow through said primary winding for discharging said storage capacitor and for interrupting said current flow through said primary winding for discharging the energy stored in said transformer through said secondary winding.

2. An energy feedback thyristor circuit as claimed in claim 1, including a second diode connected to said secondary winding for forming a blocking converter wherein current is enabled to flow in said secondary winding when a flow of current through the primary winding is interrupted.

3. An energy feedback thyristor circuit as claimed in claim 1, wherein said controllable discharge switch includes a first transistor.

4. An energy feedback thyristor circuit as claimed in claim 3, wherein said first transistor is a MOSFET.

* * * * *